(12) United States Patent
Han

(10) Patent No.: US 7,397,122 B2
(45) Date of Patent: Jul. 8, 2008

(54) METAL WIRING FOR SEMICONDUCTOR DEVICE AND METHOD FOR FORMING THE SAME

(75) Inventor: Jae Won Han, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 239 days.

(21) Appl. No.: 11/296,477

(22) Filed: Dec. 8, 2005

(65) Prior Publication Data

US 2006/0141767 A1 Jun. 29, 2006

(30) Foreign Application Priority Data

Dec. 29, 2004 (KR) ............... 10-2004-0115517

(51) Int. Cl.
*H01L 23/48* (2006.01)
*H01L 21/4763* (2006.01)
(52) U.S. Cl. ............... 257/750; 257/752; 438/622; 438/626; 438/653
(58) Field of Classification Search ............ 438/622, 438/625, 626, 627, 643, 653, 666, 668, 687; 257/750, 752, 751, 762
See application file for complete search history.

(56) References Cited

U.S. PATENT DOCUMENTS

| | | | |
|---|---|---|---|
| 6,531,777 B1 * | 3/2003 | Woo et al. | 257/752 |
| 6,555,909 B1 * | 4/2003 | Lopatin et al. | 257/751 |
| 6,884,720 B1 * | 4/2005 | Lu et al. | 438/687 |
| 6,977,218 B2 * | 12/2005 | Yu et al. | 438/633 |
| 6,998,343 B1 * | 2/2006 | Sun et al. | 438/659 |
| 7,026,235 B1 * | 4/2006 | Ben-Tzur et al. | 438/619 |
| 7,223,692 B2 * | 5/2007 | Lin et al. | 438/672 |
| 2002/0037641 A1 * | 3/2002 | Ritzdorf et al. | 438/618 |
| 2006/0177630 A1 * | 8/2006 | Lee et al. | 428/123 |
| 2006/0208272 A1 * | 9/2006 | Ritzdorf et al. | 257/100 |

* cited by examiner

*Primary Examiner*—Kevin M Picardat
(74) *Attorney, Agent, or Firm*—McKenna Long & Aldridge LLP

(57) ABSTRACT

A metal wiring for a semiconductor device and a method for forming the same are provided. The metal wiring includes a first insulating layer and a second insulating layer; an interlayer insulating film formed between the first and second insulating layers, wherein the interlayer insulating film is provided with holes having a designated shape; a barrier metal layer, a copper seed layer, and a copper layer sequentially formed in the holes of the interlayer insulating film; and a capping layer formed between the interlayer insulating film and the second insulating layer. The capping layer formed between the interlayer insulating film and the second insulating layer may be made of a negatively charged insulating material, thereby improving electro-migration characteristics at an interface between the capping layer and the copper layers.

10 Claims, 7 Drawing Sheets

METAL WIRING FOR SEMICONDUCTOR DEVICE AND METHOD FOR FORMING THE SAME

CROSS-REFERENCE TO RELATED APPLICATIONS

This application claims the benefit of Korean Patent Application No. 10-2004-0115517, filed on Dec. 29, 2004, which is hereby incorporated by reference for all purposes as if fully set forth herein.

BACKGROUND OF THE INVENTION

1. Field of the Invention

The present invention relates to a metal wiring for a semiconductor device, and more particularly to a metal wiring for a semiconductor device having improved electro-migration characteristics and a method for forming the same.

2. Discussion of the Related Art

Metal wirings for semiconductor devices are primarily made of aluminum due to its high electrical conductivity, its excellent adhesion to an oxide film, and its malleability. However, aluminum has several problems, such as a difficulty in electric migration, hillocks, and spikes, and therefore is limited in its use.

Accordingly, materials of the metal wirings having high conductivity, such as copper (Cu), gold (Au), silver (Ag), cobalt (Co), chrome (Cr), and nickel (Ni), have been researched. Among the above materials, copper (Cu) has low specific resistance, excellent reliability, and low production costs and is therefore widely used.

However, since copper cannot be easily patterned, it is difficult to form a metal wiring made of copper using a conventional method. Accordingly, a damascene structure in which a metal wiring is produced by forming trenches in an insulating film and filling the trenches with copper is employed. Particularly, a dual damascene structure in which the trenches and via holes are simultaneously formed in the insulating film is employed. A conventional metal wiring structure having a dual damascene structure is shown FIG. 1.

As shown in FIG. 1, an interlayer insulating film 20 is formed on a first insulating layer 10. Via holes and trenches having a width larger than that of the via holes are formed in the interlayer insulating film 20. A barrier metal layer 30, a copper seed layer 32, and a copper layer 34 are sequentially formed in the via holes and the trenches of the interlayer insulating film 20. A capping layer 40 is formed on the overall surface of the interlayer insulating film 20, and a second insulating layer 50 is formed on the capping layer 40. The capping layer 40 is made of an insulating film, such as an oxide film or a nitride film.

In the above metal wiring structure having the damascene structure, resistance at an interface point B, between the capping layer 40 and the copper layers 32 and 34, is higher than resistance at an interface point A, between the barrier metal layer 30 and the copper layers 32 and 34. Accordingly, there is a current flow difference, and electro-migration characteristics at the interface between the capping layer 40 and the copper layers 32 and 34 are deteriorated.

SUMMARY OF THE INVENTION

Accordingly, the present invention is directed to a metal wiring for a semiconductor device and a method for forming the same that substantially obviates one or more problems due to limitations and disadvantages of the related art.

An advantage of the present invention is that it can provide a metal wiring having improved electro-migration characteristics at an interface between a capping layer and copper layers, and a method for forming the same.

Additional features and advantages of the invention will be set forth in the description which follows, and in part will be apparent from the description, or may be learned by practice of the invention. These and other advantages of the invention will be realized and attained by the structure and method particularly pointed out in the written description and claims hereof as well as the appended drawings.

To achieve these and other advantages and in accordance with the purpose of the present invention, as embodied and broadly described, a metal wiring for a semiconductor device comprises a first insulating layer and a second insulating layer; an interlayer insulating film formed between the first and second insulating layers, wherein the interlayer insulating film is provided with holes having a designated shape; a barrier metal layer, a copper seed layer, and a copper layer sequentially formed in the holes of the interlayer insulating film; and a capping layer formed between the interlayer insulating film and the second insulating layer.

Since the capping layer formed between the interlayer insulating film and the second insulating layer is made of the negatively charged insulating material, electro-migration characteristics of an interface between the capping layer and the copper layers may be improved. Free electrons in the copper layers are repelled from the capping layer by the repulsive force of the static electricity of the capping layer. No current flows along the interface between the copper layers and the capping layer, and most current flows along an interface between the barrier metal layer and the copper layers or a grain boundary of the copper layers, thereby improving electro-migration characteristics.

In another aspect of the present invention, the holes of the interlayer insulating film may include via holes and trenches so that the metal wiring has a dual damascene structure.

In another aspect of the present invention, the holes of the interlayer insulating film include trenches so that the metal wiring has a single damascene structure.

In another aspect of the present invention, the capping layer may be a negatively charged oxide film and a negatively charged nitride film.

In another aspect of the present invention, a method for forming a metal wiring for a semiconductor device comprises sequentially forming a barrier metal layer, a copper seed layer, and a copper layer on the overall surfaces of the first and second interlayer insulating films having via holes and trenches; removing the barrier metal layer, the copper seed layer, and the copper layer from an upper surface of the second interlayer insulating film; forming a capping layer made of a negatively charged insulating material on the overall surface of the first insulating layer including the second interlayer insulating film; and forming a second insulating layer on the capping layer.

In another aspect of the present invention, a method for forming a metal wiring for a semiconductor device comprises sequentially forming a barrier metal layer, a copper seed layer, and a copper layer on the overall surfaces of the interlayer insulating film having the trenches; removing the barrier metal layer, the copper seed layer, and the copper layer from an upper surface of the interlayer insulating film; forming a capping layer made of a negatively charged insulating material on the overall surface of the first insulating layer including the interlayer insulating film; and forming a second insulating layer on the capping layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

First Exemplary Embodiment

FIGS. 2A-2J illustrate a process for forming a metal wiring for a semiconductor device in accordance with a first exemplary embodiment of the present invention. The metal wiring of the first exemplary embodiment has a dual damascene structure in which via holes and trenches may be simultaneously formed.

Figure 1:
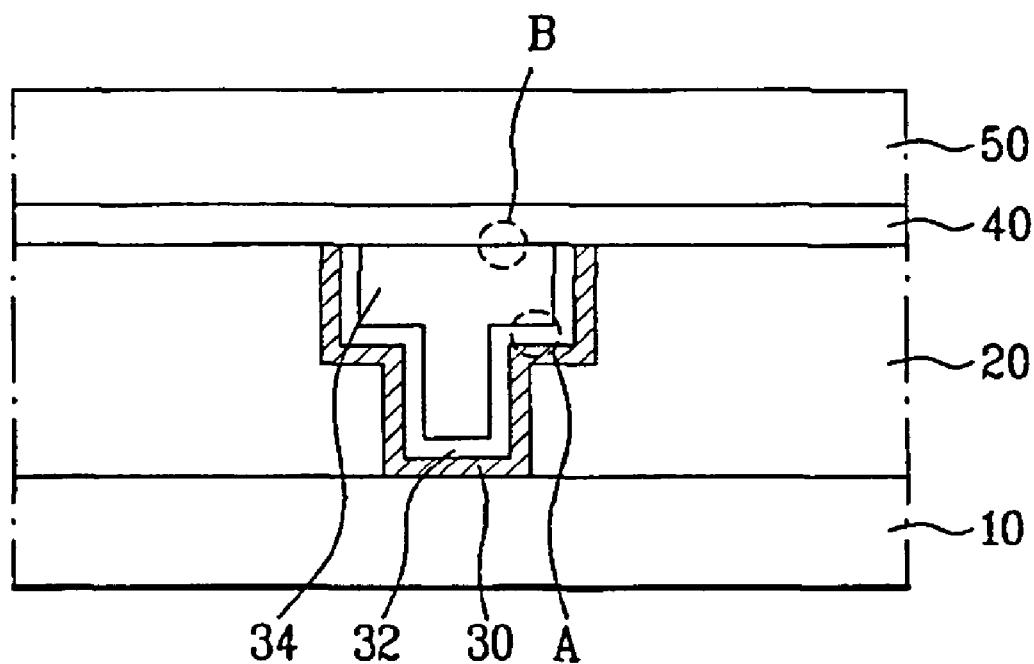
FIG. 1 is a sectional view of a metal wiring having a dual damascene structure.
Figure 2A:
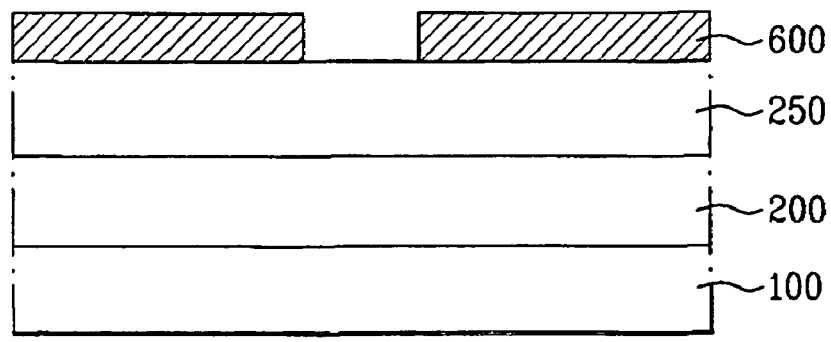
FIGS. 2A-2J are sectional views illustrating a process for forming a metal wiring for a semiconductor device in accordance with a first embodiment of the present invention.

As shown in FIG. 2A, a first interlayer insulating film 200 and a second interlayer insulating film 250 are sequentially formed on a first insulating layer 100. A first photosensitive film 600, which may be patterned so that via hole portions of the first photosensitive film 600 are removed, is formed on the second interlayer insulating film 250. The methods of forming and the materials used in forming the first insulating layer 100, the first interlayer insulating film 200, and the second interlayer insulating film 250 will be apparent to those skilled in the art, and may be variously modified. For example, the first photosensitive film 600 is formed by photolithography including light irradiation and development.

Figure 2B:
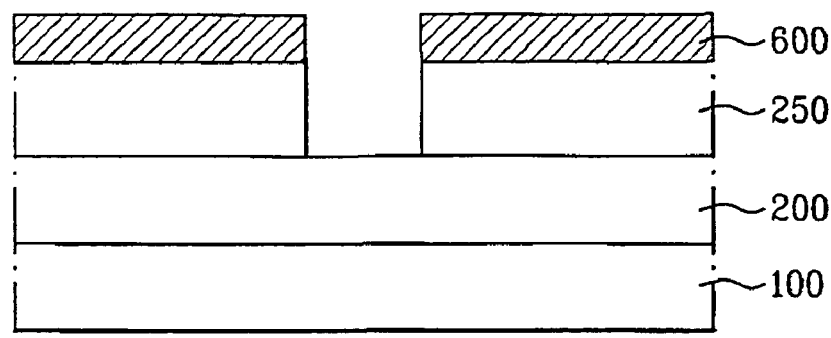

As shown in FIG. 2B, the second interlayer insulating film 250 is etched using the first photosensitive film 600 as a mask. The second interlayer insulating film 250 is etched so that via hole portions of the second interlayer insulating film 250 are removed.

Figure 2C:
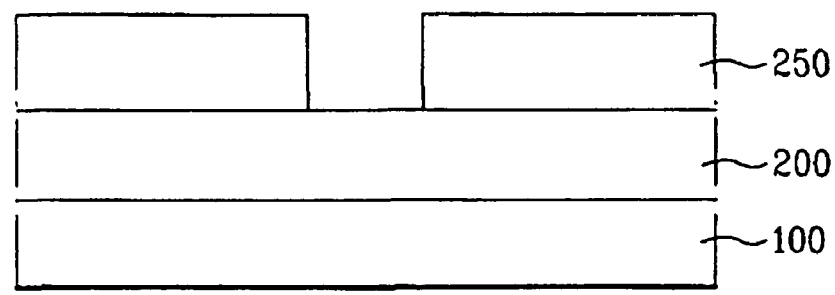

As shown in FIG. 2C, the first photosensitive film 600 is removed by ash treatment. The ash treatment of the first photosensitive film 600 may use oxygen plasma conditions.

Figure 2D:
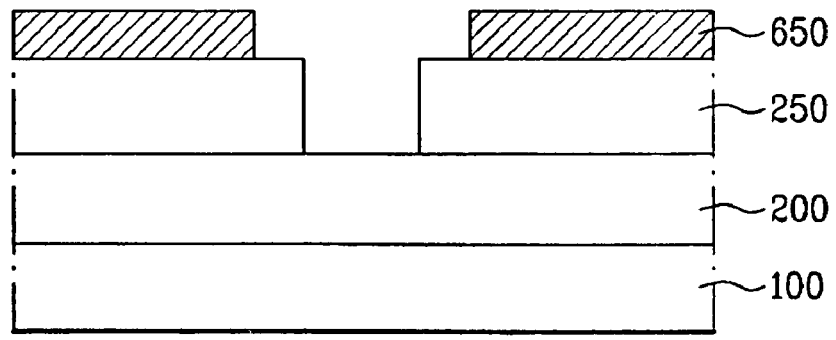

As shown in FIG. 2D, a second photosensitive film 650, which is patterned so that trench portions of the second photosensitive film 650 are removed, is formed on the second interlayer insulating film 250. In one embodiment of the present invention, in the same manner as the first photosensitive film 600, the second photosensitive film 650 is formed by photolithography. The trench portions have a larger width than that of the via holes portions.

Figure 2E:
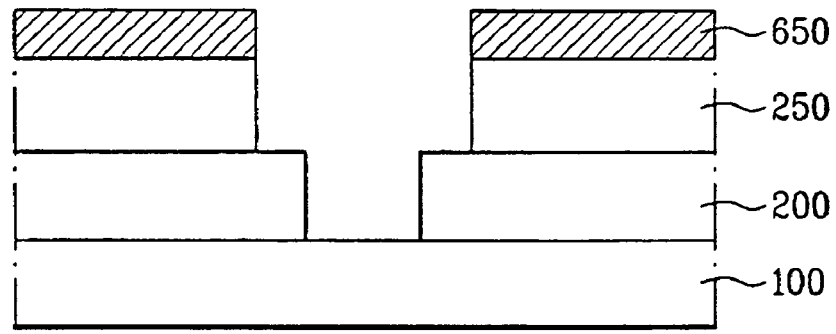

As shown in FIG. 2E, the second interlayer insulating film 250 and the first interlayer insulating film 200 are etched using the second photosensitive film 650 as a mask. By etching, trenches are formed through the second interlayer insulating film 250 and via holes are formed through the first interlayer insulating film 200.

Figure 2F:
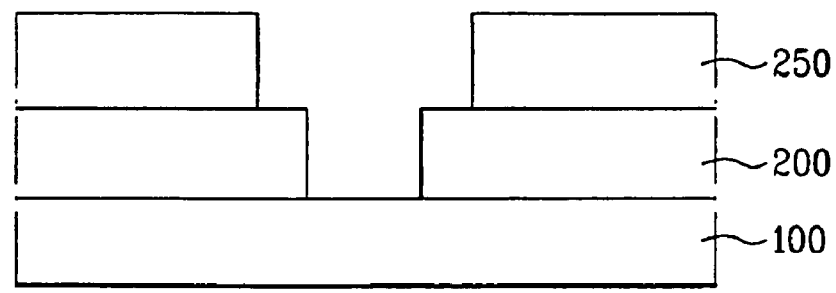

As shown in FIG. 2F, the second photosensitive film 650 is removed by ash treatment. The ash treatment of the second photosensitive film 650 may use oxygen plasma conditions.

Figure 2G:
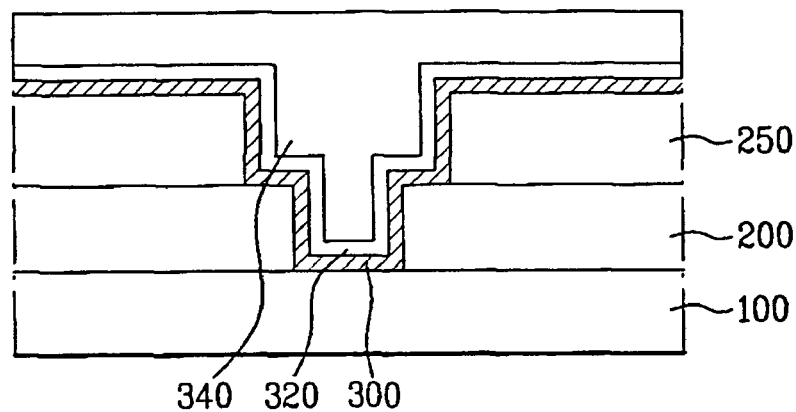

As shown in FIG. 2G, a barrier metal layer 300, a copper seed layer 320, and a copper layer 340 may be sequentially formed on the overall surfaces of the first interlayer insulating film 200 having the via holes and the second interlayer insulating film 250 having the trenches. The barrier metal layer 300 may be made of tantalum, tantalum nitride, titanium, or titanium nitride, but is not limited to these materials. The copper layer 350 may be formed by electroplating, but is not limited to this deposition process.

Figure 2H:
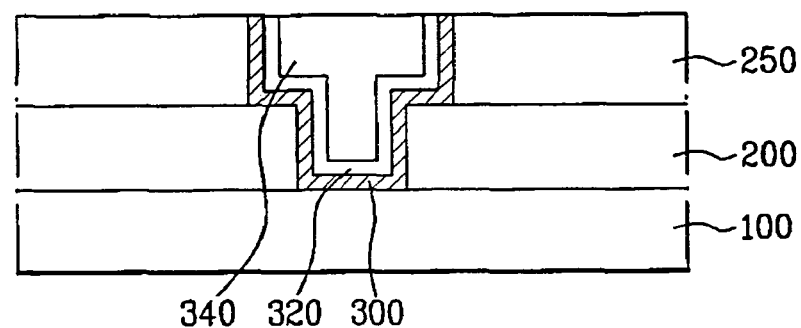

As shown in FIG. 2H, the barrier metal layer 300, the copper seed layer 320, and the copper layer 340 are removed from the upper surface of the second interlayer insulating film 250. The removal of these layers 300, 320, and 340 from the upper surface of the second interlayer insulating film 250 may be performed by chemical-mechanical polishing.

Figure 2I:
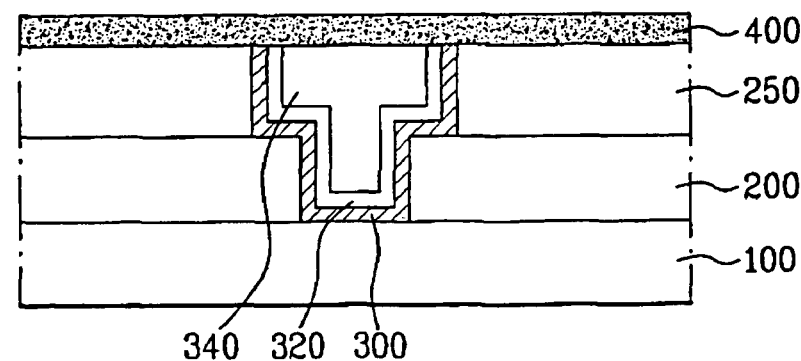

As shown in FIG. 2I, a capping layer 400 made of a negatively charged insulating material is formed on the overall surface of the first insulating layer 100 including the second interlayer insulating film 250. The capping layer 400 may be formed by applying an insulating material layer to the overall surface of the first insulating layer 100 including the second interlayer insulating film 250 and negatively charging the insulating material layer. Also, the capping layer 400 may be formed by manufacturing a negatively charged insulating material and applying the negatively charged insulating material to the overall surface of the first insulating layer 100 including the second interlayer insulating film 250.

Figure 2J:
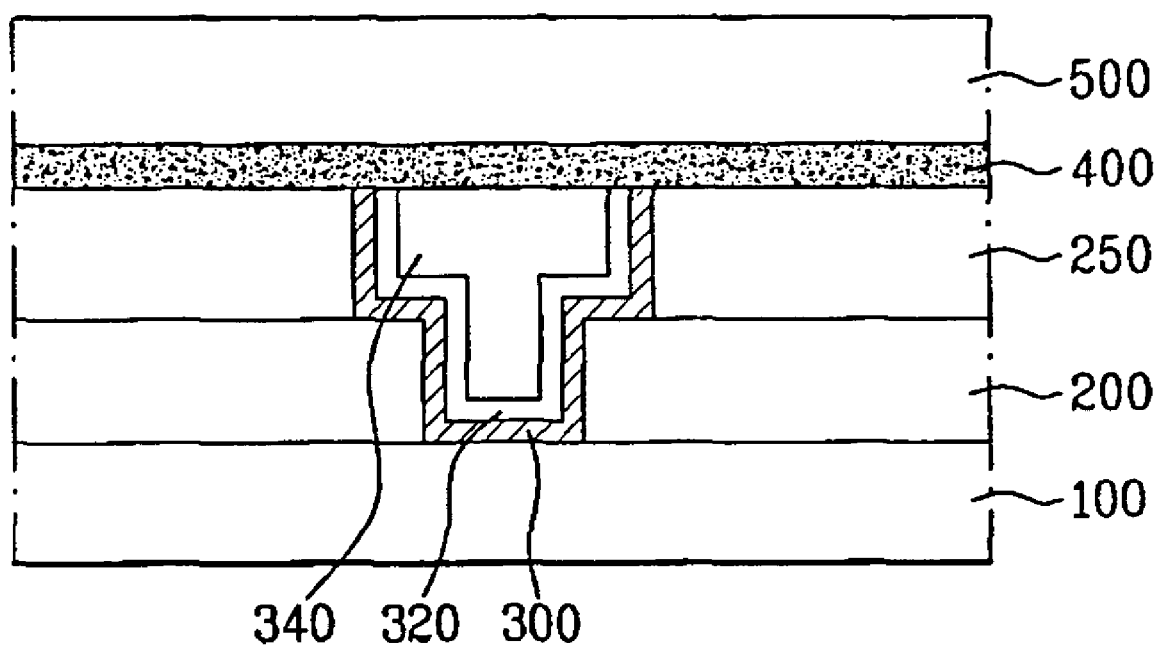

As shown in FIG. 2J, a second insulating layer 500 is formed on the capping layer 400. Thereby, the metal wiring for the semiconductor device is completed.

As shown in FIG. 2J, the metal wiring of the first embodiment comprises the first insulating layer 100 and the second insulating layer 500, the first interlayer insulating film 200 having the via holes and formed between the first and second insulating layers 100 and 500, the second interlayer insulating film 250 having the trenches and formed between the first and second insulating layers 100 and 500, the barrier metal layer 300, the copper seed layer 320, and the copper layer 340 sequentially formed in the via holes and the trenches of the first and second interlayer insulating films 200 and 250, and the negatively charged capping layer 400 formed between the second interlayer insulating film 250 and the second insulating layer 500.

Second Exemplary Embodiment

FIGS. 3A-3F illustrate a process for forming a metal wiring for a semiconductor device in accordance with a second exemplary embodiment of the present invention. The metal wiring of the second exemplary embodiment has a single damascene structure in which trenches are formed.

Figure 3A:
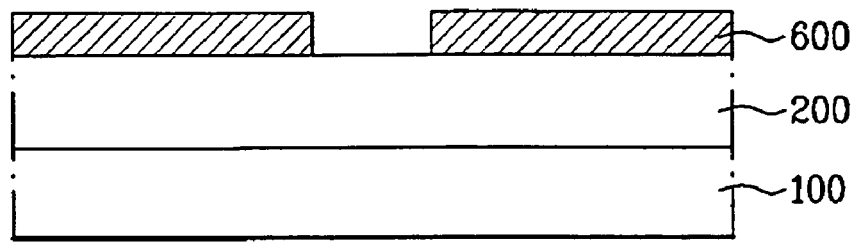
FIGS. 3A-3F are sectional views illustrating a process for forming a metal wiring for a semiconductor device in accordance with a second embodiment of the present invention.

As shown in FIG. 3A, an interlayer insulating film 200 is formed on a first insulating layer 100. A photosensitive film 600, which may be patterned so that trench portions of the photosensitive film 600 are removed, is formed on the interlayer insulating film 200. The methods of forming and the materials used in forming the first insulating layer 100 and the interlayer insulating film 200 will be apparent to those skilled in the art, and may be variously modified. In one exemplary embodiment of the present invention, the photosensitive film 600 is formed by photolithography including light irradiation and development.

Figure 3B:
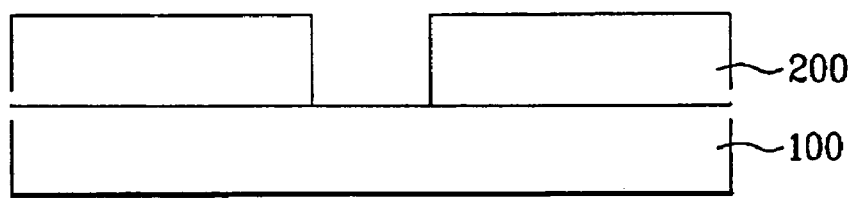

As shown in FIG. 3B, the interlayer insulating film 200 is etched using the photosensitive film 600 as a mask. The interlayer insulating film 200 is etched so that trench portions of the interlayer insulating film 200 are removed. The photosensitive film 600 is removed by ash treatment. The ash treatment of the photosensitive film 600 may use oxygen plasma conditions.

Figure 3C:
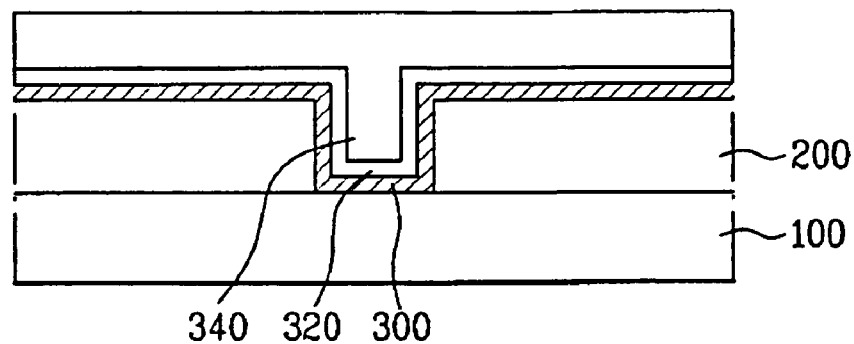

As shown in FIG. 3C, a barrier metal layer 300, a copper seed layer 320, and a copper layer 340 may be sequentially formed on the overall surfaces of the interlayer insulating film 200 in which trenches are formed. The barrier metal layer 300 may be made of tantalum, tantalum nitride, titanium, or titanium nitride, but is not limited to these materials. The copper layer 350 may be formed by electroplating, but is not limited to this deposition process.

Figure 3D:
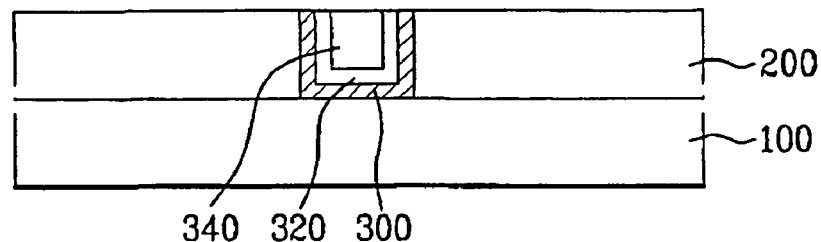

As shown in FIG. 3D, the barrier metal layer 300, the copper seed layer 320, and the copper layer 340 are removed from the upper surface of the interlayer insulating film 200. The removal of these layers 300, 320, and 340 from the upper surface of the interlayer insulating film 200 may be performed by chemical-mechanical polishing.

Figure 3E:
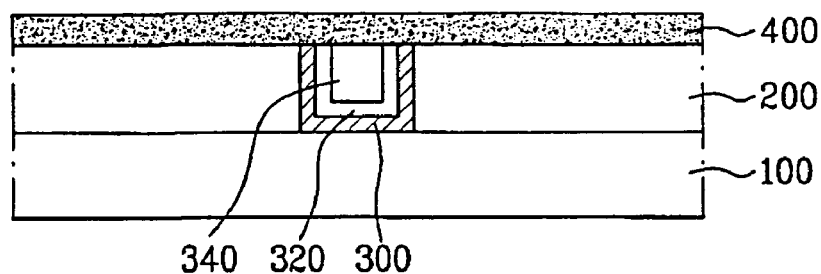

As shown in FIG. 3E, a capping layer 400 made of a negatively charged insulating material is formed on the overall surface of the first insulating layer 100 including the interlayer insulating film 200. The capping layer 400 may be formed by applying an insulating material layer to the overall surface of the first insulating layer 100 including the interlayer insulating film 200 and negatively charging the insulating material layer. The capping layer 400 may also be formed by manufacturing a negatively charged insulating material and applying the negatively charged insulating material to the overall surface of the first insulating layer 100 including the interlayer insulating film 200.

Figure 3F:
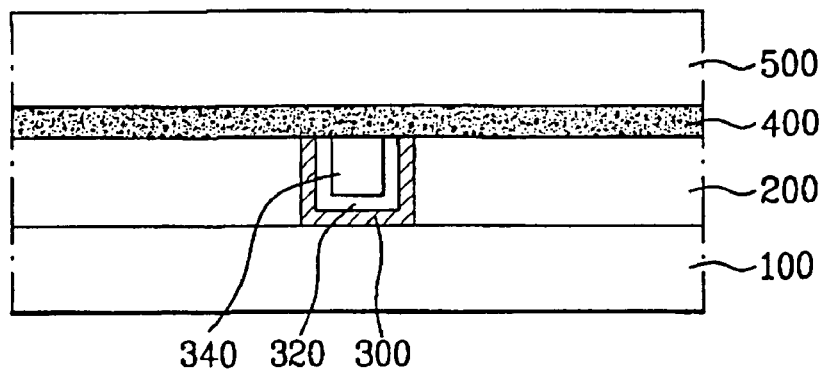

As shown in FIG. 3F, a second insulating layer 500 is formed on the capping layer 400. Thus, the metal wiring for the semiconductor device is completed.

As shown in FIG. 3F, the metal wiring of the second exemplary embodiment comprises the first insulating layer 100 and the second insulating layer 500, the interlayer insulating film 200 having the trenches and formed between the first and second insulating layers 100 and 500, the barrier metal layer 300, the copper seed layer 320, and the copper layer 340 sequentially formed in the trenches of the interlayer insulating film 200, and the negatively charged capping layer 400 formed between the interlayer insulating film 200 and the second insulating layer 500.

The metal wiring for a semiconductor device and a method for forming the same, in which a capping layer formed between an interlayer insulating film and a second insulating layer is made of a negatively charged insulating material may improve electro-migration characteristics at an interface between the capping layer and copper layers.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A metal wiring for a semiconductor device, comprising:
a first insulating layer and a second insulating layer;
an interlayer insulating film formed between the first and second insulating layers, wherein the interlayer insulating film is provided with holes having a designated shape;
a barrier metal layer, a copper seed layer, and a copper layer sequentially formed in the holes of the interlayer insulating film; and
a capping layer formed between the interlayer insulating film and the second insulating layer, wherein the capping layer is made of a negatively charged insulating material.

2. The metal wiring of claim 1, wherein the holes include trenches.

3. The metal wiring of claim 1, wherein the holes include via holes and trenches.

4. The metal wiring of claim 1, wherein the capping layer is one of a negatively charged oxide film and a negatively charged nitride film.

5. A method for forming a metal wiring for a semiconductor device, comprising:
sequentially forming a first interlayer insulating film and a second interlayer insulating film on a first insulating layer;
forming a first photosensitive film on the second interlayer insulating film;
patterning the first photosensitive film so that via hole portions of the first photosensitive film are removed;
etching the second interlayer insulating film using the first photosensitive film as a mask;
removing the first photosensitive film by ash treatment;
forming a second photosensitive film on the second interlayer insulating film;
patterning the second photosensitive film so that trench portions of the second photosensitive film are removed;
etching the second and first interlayer insulating films using the second photosensitive film as a mask;
removing the second photosensitive film by ash treatment;
sequentially forming a barrier metal layer, a copper seed layer, and a copper layer on overall surfaces of the first and second interlayer insulating films having via holes and trenches;
removing the barrier metal layer, the copper seed layer, and the copper layer from an upper surface of the second interlayer insulating film;
forming a capping layer made of a negatively charged insulating material on the overall surface of the first insulating layer including the second interlayer insulating film; and
forming a second insulating layer on the capping layer.

6. The method of claim 5, wherein forming a capping layer made of the negatively charged insulating material comprises forming an insulating material layer and negatively charging the insulating material layer.

7. The method of claim 5, wherein forming a capping layer made of the negatively charged insulating material comprises producing the negatively charged insulating material and applying the negatively charged insulating material to the overall surface of the first insulating layer including the interlayer insulating film.

8. A method for forming a metal wiring for a semiconductor device, comprising:
forming an interlayer insulating film on a first insulating layer;
forming a photosensitive film on the interlayer insulating film;
patterning the photosensitive film so that trench portions of the photosensitive film are removed;

etching the interlayer insulating film using the photosensitive film as a mask to form trenches;

removing the photosensitive film by ash treatment;

sequentially forming a barrier metal layer, a copper seed layer, and a copper layer on overall surfaces of the interlayer insulating film having the trenches;

removing the barrier metal layer, the copper seed layer, and the copper layer from an upper surface of the interlayer insulating film;

forming a capping layer made of a negatively charged insulating material on the overall surface of the first insulating layer including the interlayer insulating film; and forming a second insulating layer on the capping layer.

9. The method of claim 8, wherein forming a capping layer made of the negatively charged insulating material comprises forming an insulating material layer and negatively charging the insulating material layer.

10. The method of claim 8, wherein forming a capping layer made of the negatively charged insulating material comprises producing the negatively charged insulating material and applying the negatively charged insulating material to the overall surface of the first insulating layer including the interlayer insulating film.

* * * * *